US010886102B2

(12) United States Patent
Inoue et al.

(10) Patent No.: US 10,886,102 B2
(45) Date of Patent: Jan. 5, 2021

(54) MULTIPLE ELECTRON BEAM IRRADIATION APPARATUS, MULTIPLE ELECTRON BEAM IRRADIATION METHOD, AND MULTIPLE ELECTRON BEAM INSPECTION APPARATUS

(71) Applicants: NuFlare Technology, Inc., Yokohama (JP); NuFlare Technology America, Inc., Sunnyvale, CA (US)

(72) Inventors: Kazuhiko Inoue, Yokohama (JP); Munehiro Ogasawara, Yokohama (JP); Steven Golladay, Hopewell Junction, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 33 days.

(21) Appl. No.: 16/502,706

(22) Filed: Jul. 3, 2019

(65) Prior Publication Data
US 2020/0013585 A1    Jan. 9, 2020

Related U.S. Application Data

(60) Provisional application No. 62/704,015, filed on Jul. 5, 2018.

(51) Int. Cl.
*H01J 37/28* (2006.01)
*H01J 37/145* (2006.01)
(Continued)

(52) U.S. Cl.
CPC ............ *H01J 37/28* (2013.01); *H01J 37/145* (2013.01); *H01J 37/3007* (2013.01);
(Continued)

(58) Field of Classification Search
CPC ...... H01J 37/145; H01J 37/3177; H01J 37/28; H01J 2237/21; H01J 2237/216
See application file for complete search history.

(56) References Cited

U.S. PATENT DOCUMENTS 4,458,151 A * 7/1984 Koike ................. H01J 37/04
250/310
5,864,142 A   1/1999 Muraki et al.
(Continued)

FOREIGN PATENT DOCUMENTS

JP    H09-330867    12/1997
JP    H11-54412     2/1999
(Continued)

OTHER PUBLICATIONS

Combined Taiwanese Office Action and Search Report dated Apr. 20, 2020 in corresponding Taiwanese Patent Application No. 108121084 (with English Translation), 7 pages.

*Primary Examiner* — Eliza W Osenbaugh-Stewart
(74) *Attorney, Agent, or Firm* — Oblon, McClelland, Maier & Neustadt, L.L.P.

(57) ABSTRACT

A multiple-electron-beam irradiation apparatus includes a first electrostatic lens, configured using the substrate used as a bias electrode by being applied with a negative potential, a control electrode to which a control potential is applied and a ground electrode to which a ground potential is applied, configured to provide dynamic focusing of the multiple electron beams onto the substrate, in accordance with change of the height position of the surface of the substrate, by generating an electrostatic field, wherein the control electrode is disposed on an upstream side of a maximum magnetic field of the lens magnetic field of the first electromagnetic lens with respect to a direction of a trajectory central axis of the multiple electron beams, and a ground electrode is disposed on an upstream side of the control electrode with respect to the direction of the trajectory central axis.

5 Claims, 12 Drawing Sheets

(51) Int. Cl.
*H01J 37/30* (2006.01)
*H01J 37/304* (2006.01)
*H01J 37/317* (2006.01)

(52) U.S. Cl.
CPC ....... *H01J 37/3045* (2013.01); *H01J 37/3177* (2013.01); *H01J 2237/216* (2013.01)

(56) References Cited

U.S. PATENT DOCUMENTS

| | | | |
|---|---|---|---|
| 6,011,268 A | 1/2000 | Nakasuji | |
| 7,041,988 B2 | 5/2006 | Hamaguchi et al. | |
| 7,560,713 B2 | 7/2009 | Doering et al. | |
| 8,884,254 B2 | 11/2014 | Touya et al. | |
| 8,927,941 B2 | 1/2015 | Touya et al. | |
| 9,343,266 B2 | 5/2016 | Ogasawara et al. | |
| 2014/0175303 A1* | 6/2014 | Touya | H01J 37/3026 250/398 |
| 2016/0217968 A1* | 7/2016 | Li | H01J 37/1477 |

FOREIGN PATENT DOCUMENTS

| | | |
|---|---|---|
| JP | 2003-332207 | 11/2003 |
| JP | 2007-534121 | 11/2007 |
| JP | 2013-197289 | 9/2013 |
| JP | 2014-49545 | 3/2014 |
| JP | 2014-127568 | 7/2014 |

* cited by examiner

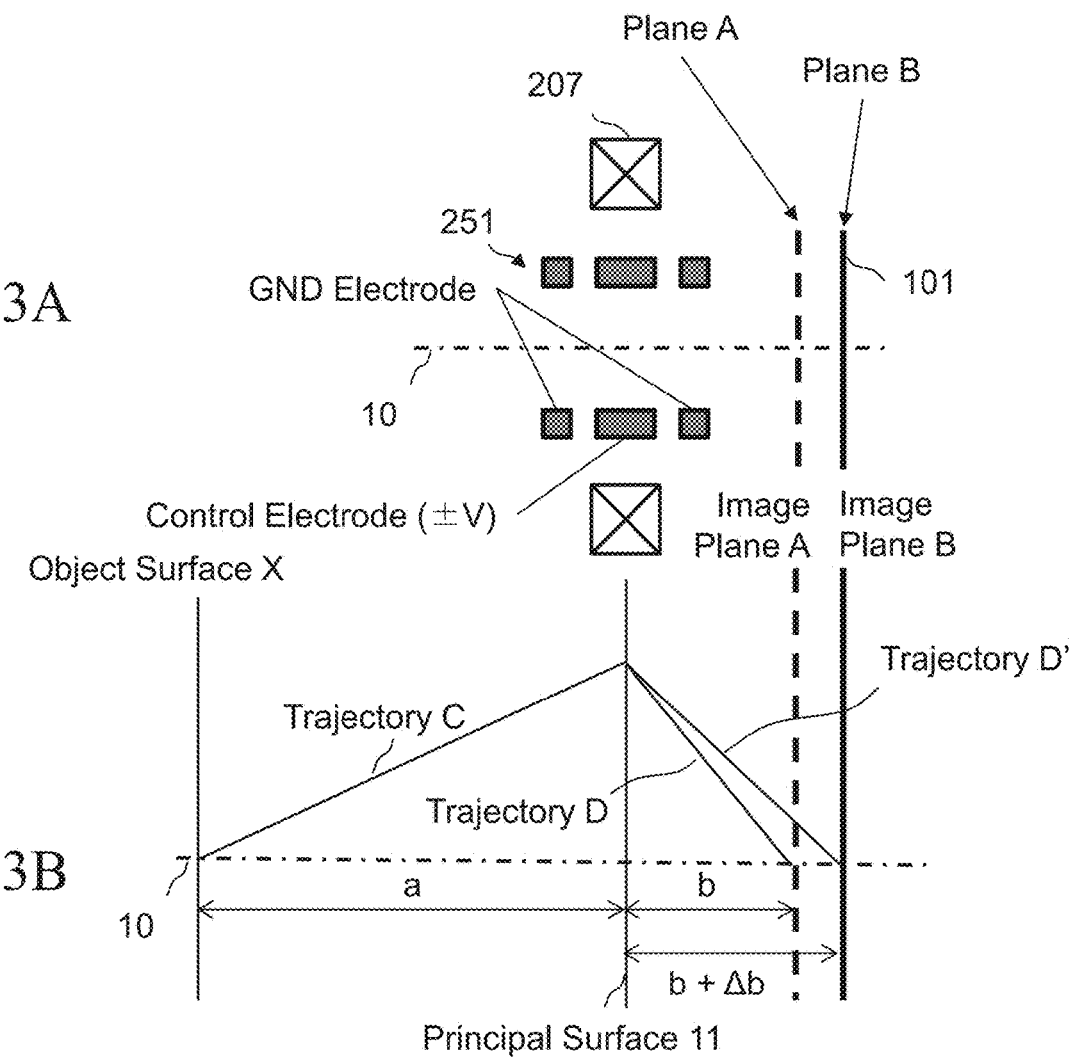

MULTIPLE ELECTRON BEAM IRRADIATION APPARATUS, MULTIPLE ELECTRON BEAM IRRADIATION METHOD, AND MULTIPLE ELECTRON BEAM INSPECTION APPARATUS

CROSS-REFERENCE TO RELATED APPLICATION

This application is based upon and claims the benefit of priority from prior Provisional Patent Application No. 62/704,015 filed on Jul. 5, 2018 in U.S.A., the entire contents of which are incorporated herein by reference.

BACKGROUND OF THE INVENTION

Field of the Invention

Embodiments of the present invention relate to a multiple electron beam irradiation apparatus, a multiple electron beam irradiation method, and a multiple electron beam inspection apparatus. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integrated circuits), the line width (critical dimension) required for circuits of semiconductor elements is becoming increasingly narrower. Since LSI manufacturing requires a tremendous amount of manufacturing cost, it is crucially essential to improve its yield. However, as typified by a 1-gigabit DRAM (Dynamic Random Access Memory), the scale of patterns which configure the LSI now has become on the order of nanometers from submicrons. Also, in recent years, with miniaturization of LSI patterns formed on a semiconductor wafer, dimensions of a pattern defect needed to be detected have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging an identical pattern on the substrate. For example, as a pattern inspection method, there are "die-to-die inspection" and "die-to-database inspection". The "die-to-die inspection" method compares data of measured images acquired by imaging identical patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After alignment between images, the comparison circuit compares the measured data with the reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with electron beams and detecting secondary electrons emitted from the inspection substrate by the irradiation with the electron beams. With the inspection apparatus utilizing an electron beam, an apparatus using multiple beams has also been developed. Regarding such an inspection apparatus using multiple beams, the height position of the surface of the inspection substrate changes due to unevenness such as thickness variation of the substrate. Accordingly, when the substrate is irradiated with multiple beams, it is needed to correct a focus position depending on unevenness of the substrate surface. If the focus position is corrected, magnification change and rotation change of an image occur along with the correction. Therefore, these three change factors need to be corrected simultaneously. It is theoretically possible to correct these three change factors, for example, by using three or more electrostatic lenses (refer to, e.g., Japanese Patent Application Laid-open (JP-A) No. 2014-127568). However, if one change factor is corrected, other change factors deviate further, thereby being difficult to control these three change factors individually. Then, in order to reduce these associated three changes, in a balanced manner as much as possible, controlling to optimize adjustment of the three or more electrostatic lenses is needed. However, performing such controlling renders the control system enlarged. Therefore, a structure is required which enables to perform the control easier compared to the conventional one. This problem is not limited to the inspection apparatus, and may similarly occur in the apparatus irradiating the substrate with focused multiple beams.

BRIEF SUMMARY OF THE INVENTION

According to one aspect of the present invention, a multiple electron beam irradiation apparatus includes a stage configured to mount thereon a substrate to be irradiated with multiple electron beams; a first electromagnetic lens, disposed such that a center of a lens magnetic field is located at a height position of a surface of the substrate, configured to focus the multiple electron beams onto the substrate; and a first electrostatic lens, configured using the substrate used as a bias electrode by being applied with a negative potential, a control electrode to which a control potential is applied and a ground electrode to which a ground potential is applied, the first electrostatic lens configured to provide dynamic focusing of the multiple electron beams onto the substrate, in accordance with change of the height position of the surface of the substrate, by generating an electrostatic field, wherein the control electrode is disposed on an upstream side of a maximum magnetic field of the lens magnetic field of the first electromagnetic lens with respect to a direction of a trajectory central axis of the multiple electron beams, and a ground electrode is disposed on an upstream side of the control electrode with respect to the direction of the trajectory central axis.

According to another aspect of the present invention, a multiple electron beam irradiation method includes focusing multiple electron beams, which are to irradiate a substrate placed on a stage, onto the substrate by a first electromagnetic lens disposed such that a center of a lens magnetic field is located at a height position of a surface of the substrate; and dynamically focusing the multiple electron beams onto the substrate, in accordance with change of the height position of the surface of the substrate, by generating an electrostatic field by a first electrostatic lens including a control electrode which is disposed on an upstream side of a maximum magnetic field of the lens magnetic field of the first electromagnetic lens with respect to a direction of a trajectory central axis of the multiple electron beams and to which a control potential is applied, and a ground electrode which is disposed on an upstream side of the control electrode with respect to the direction of the trajectory central axis and to which a ground potential is applied, and using the substrate as a bias electrode by being applied with a negative potential.

According to yet another aspect of the present invention, a multiple electron beam inspection apparatus includes a stage configured to mount thereon a substrate to be irradiated with multiple electron beams; a first electromagnetic lens, disposed such that a center of a lens magnetic field is located at a height position of a surface of the substrate, configured to focus the multiple electron beams onto the substrate; a first electrostatic lens configured using the substrate used as a bias electrode by being applied with a negative potential, a control electrode to which a control potential is applied and a ground electrode to which a ground potential is applied, the first electrostatic lens configured to provide dynamic focusing of the multiple electron beams onto the substrate, in accordance with change of the height position of the surface of the substrate, by generating an electrostatic field, wherein the control electrode is disposed on an upstream side of a maximum magnetic field of the lens magnetic field of the first electromagnetic lens with respect to a direction of a trajectory central axis of the multiple electron beams, and a ground electrode is disposed on an upstream side of the control electrode with respect to the direction of the trajectory central axis; and a multi-detector that detects multiple secondary electron beams, including reflected electrons, emitted from the substrate due to that the substrate is irradiated with the multiple electron beams.

BRIEF DESCRIPTION OF THE DRAWINGS

FIG. 3A shows an example of arrangement structure of an objective lens and an electrostatic lens according to a comparative example of the first embodiment;

FIG. 3B shows a central beam trajectory according to a comparative example of the first embodiment;

DETAILED DESCRIPTION OF THE INVENTION

Embodiments below describe a multiple electron beam inspection apparatus as an example of a multiple electron beam irradiation apparatus. The multiple electron beam irradiation apparatus is not limited to the inspection apparatus, and may be, for example, any apparatus which irradiates multiple electron beams through an electron optical system.

First Embodiment

Figure 1:
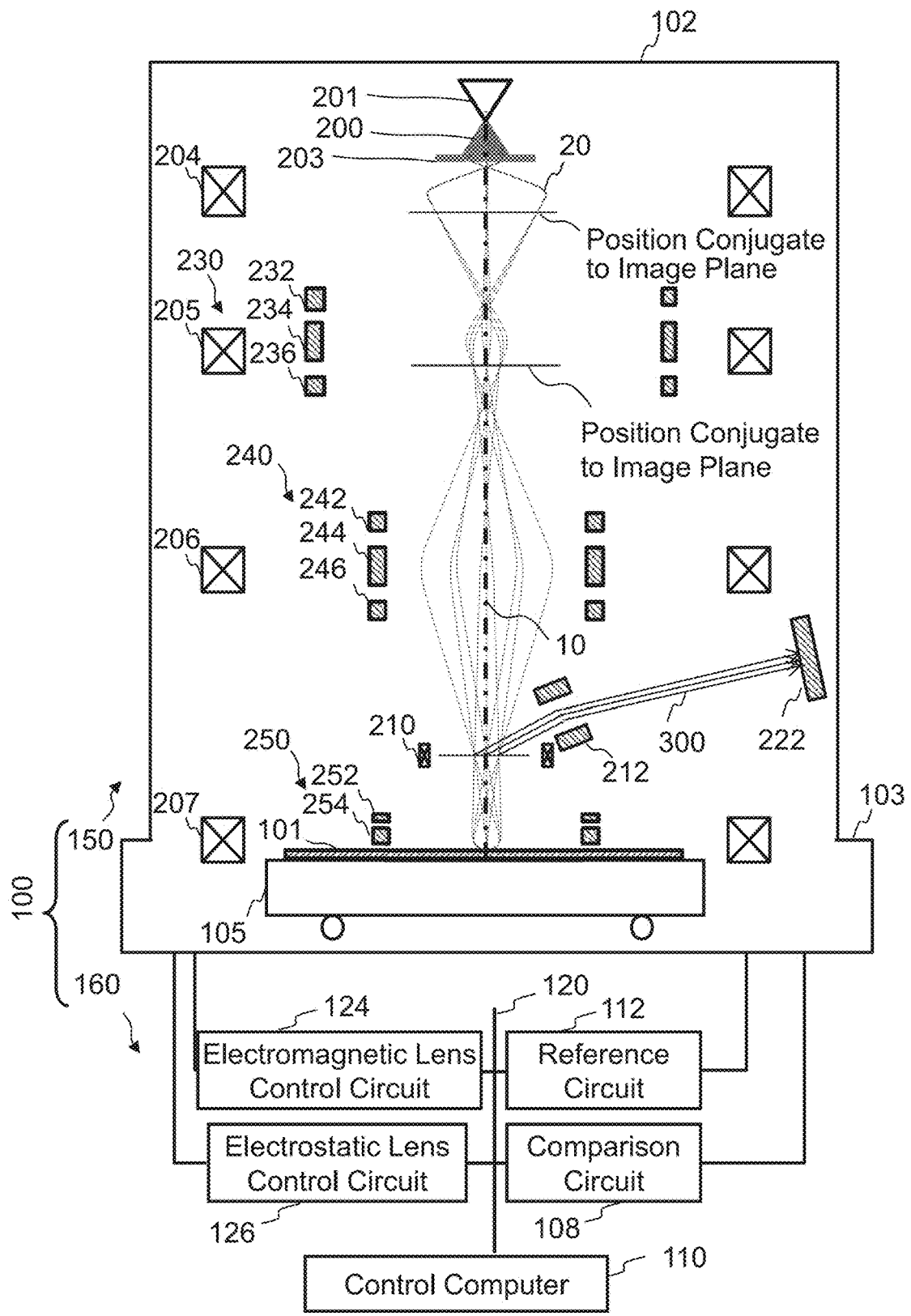
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, a shaping aperture array substrate 203, an electromagnetic lens 204, an electromagnetic lens 205, an electrostatic lens 230, an electromagnetic lens 206, an electrostatic lens 240, an electromagnetic lens 207 (objective lens), an electrostatic lens 250, a beam separator 210, a deflector 212, and a multi-detector 222.

In the inspection chamber 103, there is disposed an XY stage 105 movable at least in the x-y plane. On the XY stage 105, there is placed a substrate 101 (target object) to be inspected. The substrate 101 may be an exposure mask, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed/transferred onto a semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward, on the XY stage 105, for example.

In the control system circuit 160, a control computer 110 which controls the whole of the inspection apparatus 100 is connected, through a bus 120, to a comparison circuit 108, a reference circuit 112, an electromagnetic lens control circuit 124, and an electrostatic lens control circuit 126. In addition, a control circuit (not shown), a storage device such as a magnetic disk drive, a monitor, a memory, a printer, etc. may be connected to the control computer 110.

The electromagnetic lenses 204, 205, and 206, the electromagnetic lens 207 (objective lens), and the beam separator 210 are controlled by the electromagnetic lens control circuit 124. The deflector 212 is configured by four or more electrodes (or "four or more poles"), and is controlled, for each electrode, by a deflection control circuit (not shown) through a DAC amplifier (not shown).

According to the first embodiment, as shown in FIG. 1, the electrostatic lenses 230 and 240 are disposed on the upstream side of the electrostatic lens 250 with respect to the direction of the trajectory central axis of multiple beams 20. The electrostatic lens 240 is arranged between the electrostatic lenses 230 and 250.

The electrostatic lens 230 (second electrostatic lens) is composed of three or more electrodes (in the case of FIG. 1, an upper electrode 232, a middle electrode 234, and a lower electrode 236). In the center of each of the three or more electrodes, there is formed an opening through which all the multiple beams 20 can pass. The electrostatic lens 230 is arranged in the magnetic field of the electromagnetic lens 205 (second magnetic lens). Furthermore, preferably, the electrostatic lens 230 is arranged such that the middle electrode 234 is located at the height position of the magnetic field center of the electromagnetic lens 205 (second magnetic lens). The electrostatic lens 230 is controlled by the electrostatic lens control circuit 126. Ground potential is applied to the upper electrode 232 and the lower electrode 236, and control potential (positive potential or negative potential) is applied to the middle electrode 234.

The electrostatic lens 240 (third electrostatic lens) is composed of three or more electrodes (in the case of FIG. 1, an upper electrode 242, a middle electrode 244, and a lower electrode 246). In the center of each of the three or more electrodes, there is formed an opening through which all the multiple beams 20 can pass. The electrostatic lens 240 is arranged in the magnetic field of the electromagnetic lens 206 (third magnetic lens). Furthermore, preferably, the electrostatic lens 240 is arranged such that the middle electrode 244 is located at the height position of the magnetic field center of the electromagnetic lens 206 (third magnetic lens). The electrostatic lens 240 is controlled by the electrostatic lens control circuit 126. Ground potential is applied to the upper electrode 242 and the lower electrode 246, and control potential (positive potential or negative potential) is applied to the middle electrode 244.

The electrostatic lens 250 (first electrostatic lens) is composed of three or more electrodes (in the case of FIG. 1, an upper electrode 252, a middle electrode 254, and the substrate 101 doubling as a lower electrode). In the center of each of the three or more electrodes, there is formed an opening through which all the multiple beams 20 can pass. The electromagnetic lens 207 (objective lens) (first electromagnetic lens) is arranged such that the center of the magnetic field of the electromagnetic lens 207 is located close to the height position of the surface of the substrate 101. Furthermore, preferably, the electromagnetic lens 207 is arranged such that the center of the magnetic field of the electromagnetic lens 207 is located at the height position of the surface of the substrate 101. The middle electrode 254 (control electrode) is arranged in the magnetic field of the electromagnetic lens 207, and on the upstream side of the maximum magnetic field with respect to the direction of the trajectory central axis (optical axis or trajectory central axis of the center beam) of the multiple beams 20. The upper electrode 252 (ground electrode) is arranged in the magnetic field of the electromagnetic lens 207, and on the upstream side of the middle electrode 254 with respect to the direction of the trajectory central axis of the multiple beams 20. The electrostatic lens 250 is controlled by the electrostatic lens control circuit 126. Ground potential is applied to the upper electrode 252. Control potential (positive potential or negative potential) is applied to the middle electrode 254. Negative potential is applied to the substrate 101 which doubles as the lower electrode (bias electrode).

FIG. 1 shows configuration elements necessary for describing the first embodiment. It should be understood that other configuration elements generally necessary for the inspection apparatus 100 may also be included therein.

Figure 2:
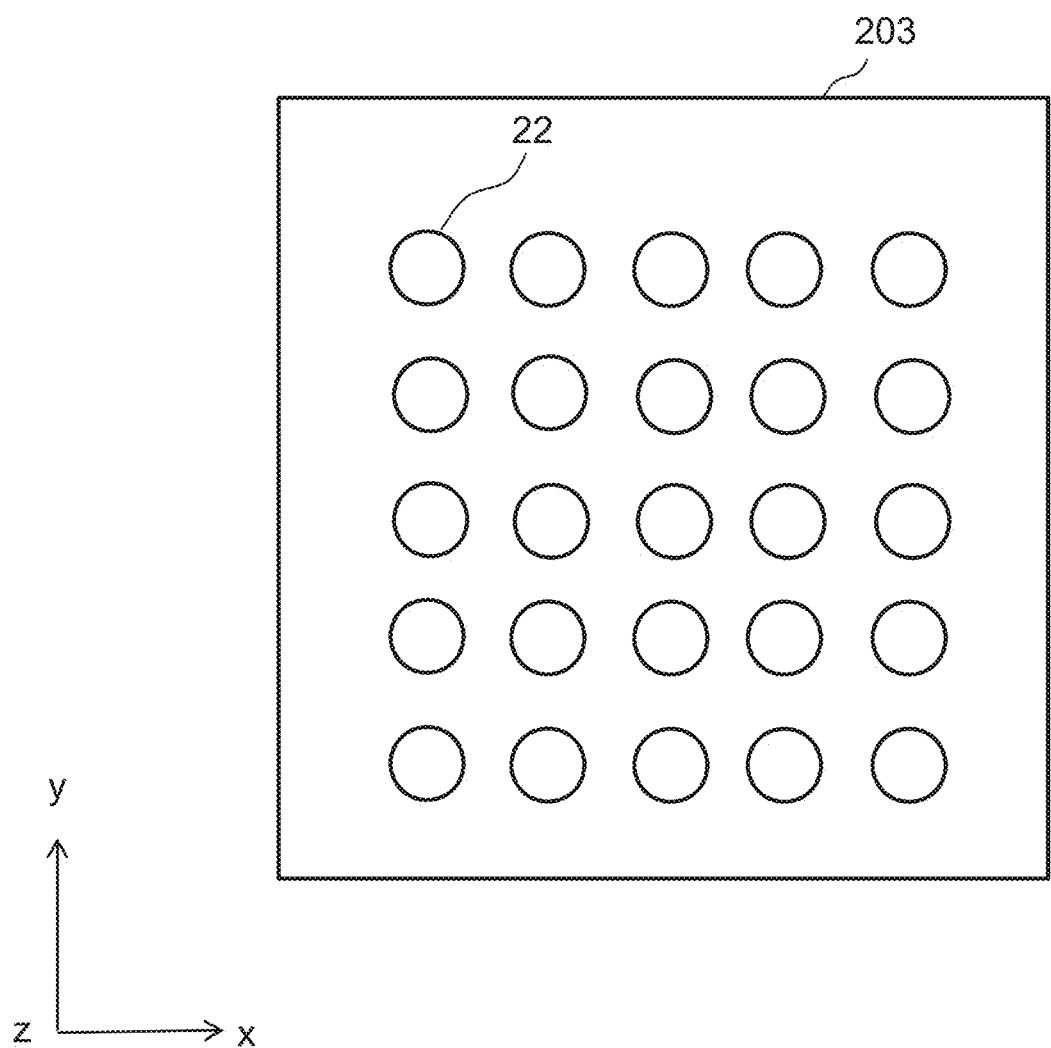
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction) are two-dimensionally formed at a predetermined arrangement pitch in the shaping aperture array substrate 203, where $m_1$ and $n_1$ are integers of 2 or more. In the case of FIG. 2, holes (openings) 22 of 5×5, that is 5(columns of holes arrayed in the x direction)×5 (rows of holes arrayed in the y direction), are formed. The number of arrayed holes 22 is not limited thereto. Each of the holes 22 is a circle with the same outer diameter. Alternatively, each of the holes 22 may be a rectangle (including a square) having the same dimension, shape, and size. The multiple beams 20 are formed by letting portions of the electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged in a grid form in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2) th row may be mutually displaced in the width direction (in the x direction) by a dimension "b".

Now, operations of the image acquisition mechanism 150 in the inspection apparatus 100 are described below.

The electron beam 200 emitted from the electron gun 201 (emission source) illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple beams 20 (multiple primary electron beams) are formed by letting portions of the electron beam 200, which irradiate the positions of a plurality of holes 22, individually pass through a corresponding one of the plurality of holes 22 in the shaping aperture array substrate 203.

The formed multiple beams 20 are individually refracted by the electromagnetic lenses 204, 205, and 206, and travel to the the electromagnetic lens 207 (objective lens) through the beam separator 210 while repeating forming an intermediate image and a crossover. Then, the electromagnetic lens 207 focuses the multiple beams 20 onto the substrate 101. The multiple beams 20 having been focused on the substrate 101 (target object) by the objective lens 207 irradiate respective beam irradiation positions on the substrate 101.

A flux of secondary electrons (multiple secondary electron beams 300) including reflected electrons, each corresponding to each of the multiple beams 20 (multiple primary electron beams), is emitted from the substrate 101 because desired positions on the substrate 101 are irradiated with the multiple beams 20.

The multiple secondary electron beams 300 emitted from the substrate 101 travel to the beam separator 210.

The beam separator 210 generates an electric field and a magnetic field to be orthogonal to each other in a plane perpendicular to the traveling direction (trajectory central axis) of the center beam of the multiple beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple beams 20 entering the beam separator 210 from the upper side, since the force due to the electric field and the force due to the magnetic field cancel each other out, the multiple beams 20 travel straight downward. In contrast, with respect to the multiple secondary electron beams 300 entering the beam separator 210 from the lower side, since both the force due to the electric field and the force due to the magnetic field are exerted in the same direction, the multiple secondary electron beams 300 are bent obliquely upward, and separated from the multiple beams 20.

The multiple secondary electron beams 300 bent obliquely upward and separated from the multiple beams 20 are further bent by the deflector 212, and projected onto the multi-detector 222 while being refracted by a projection lens (not shown). FIG. 1 shows a simplified trajectory of the multiple secondary electron beams 300 without refraction. The multi-detector 222 detects the projected multiple secondary electron beams 300. The multi-detector 222 includes, for example, a diode type two-dimensional sensor (not shown). Then, at a diode type two-dimensional sensor position corresponding to each beam of the multiple beams 20, each secondary electron of the multiple secondary electron beams 300 collides with a diode type two-dimensional sensor to generate an electron, and produces secondary electron image data for each pixel. The intensity signal detected by the multi-detector 222 is output to the comparison circuit 106.

The height position of the surface of the substrate 101 serving as an inspection target changes because unevenness exists on the surface of the substrate 101 due to thickness variation of the substrate. Therefore, when the substrate 101 is irradiated with the multiple beams 20, it is needed to dynamically correct the focus position depending on unevenness of the surface of the substrate 101. If a focus position change $\Delta Z$ is corrected, a magnification change $\Delta M$ and a rotation change $\Delta \theta$ of an image occur along with the correction. Therefore, these three change factors need to be corrected simultaneously. It is theoretically possible to correct these three change factors by using three or more electrostatic lenses, for example. However, as described above, if one change factor is corrected, other change factors deviate further, thereby being difficult to control these three change factors individually. Then, in order to reduce in a balanced manner as much as possible these associated three changes, controlling to optimize adjustment of the three or more electrostatic lenses is needed. However, performing such controlling renders the control system enlarged. Then, according to the first embodiment, it is configured such that the sensitivities to the three change factors, that is, the focus position change $\Delta Z$, and the magnification change $\Delta M$ and rotation change $\Delta \theta$ of an image, are different from each other among the three electrostatic lenses 230, 240 and 250.

FIG. 3A shows an example of arrangement structure of an objective lens and an electrostatic lens according to a comparative example of the first embodiment. FIG. 3B shows a central beam trajectory according to the comparative example of the first embodiment. As shown in FIG. 3A, in the comparative example of the first embodiment, the electromagnetic lens 207 (objective lens) is disposed such that the center of the magnetic field is located on the upstream side of the surface of the substrate 101 with respect to the direction of trajectory central axis 10 of the multiple beams. Then, the multiple beams are focused onto, for example, the plane A of the substrate 101 by the electromagnetic lens 207 (objective lens) at the position described above. Moreover, in the comparative example of the first embodiment, the control electrode is disposed at the center of the magnetic field of the electromagnetic lens 207, and an electrostatic lens 251 in which ground electrodes are individually arranged at the upper side and lower side of the control electrode is disposed. Then, when the surface of the substrate 101 is changed from the plane A to the plane B, the multiple beams are dynamically focused onto the plane B by the electrostatic lens 251. In such a case, in the comparative example, if setting the magnification at the image plane A to be M, and the magnification in the case of being focused on the plane B to be M1, the magnification M can be defined by the following equation (1) using a distance "a" from the object surface X to a principal surface 11 of the lens at the same position as the center of the magnetic field, and a distance "b" from the principal surface 11 of the lens to the image plane A as shown in FIG. 3B. The principal surface 11 of the lens indicates here a plane at the position of the intersection between the trajectory C of an electron emitted to the principal surface 11 of the lens from the object surface X, and the trajectory D of an electron going to the image plane A from the principal surface 11 of the lens.

$$M = b/a \tag{1}$$

When the focus position is corrected from the image plane A to the image plane B, the distance "b" is changed by a change amount $\Delta b$ to be $(b+\Delta b)$. Therefore, the magnification M1 can be defied by the following equation (2) using the distance "a" to the principal surface 11 of the lens, and the distance $(b+\Delta b)$ to the principal surface 11 of the lens. The principal surface 11 of the lens indicates here a plane at the position of the intersection between the trajectory C of an electron emitted to the principal surface 11 of the lens from the object surface X, and the trajectory D' of an electron going to the image plane B from the principal surface 11 of the lens.

$$M1=(b+\Delta b)/a=(b/a)(1+\Delta b/b)=M(1+\Delta b/b) \quad (2)$$

As shown in the equation (2), it turns out that the magnification of an image changes depending on change of an imaging surface (focus position). Moreover, since the electrostatic lens 251 is arranged at the center of the magnetic field, the rotation change of multiple beams becomes large.

Figure 4A:
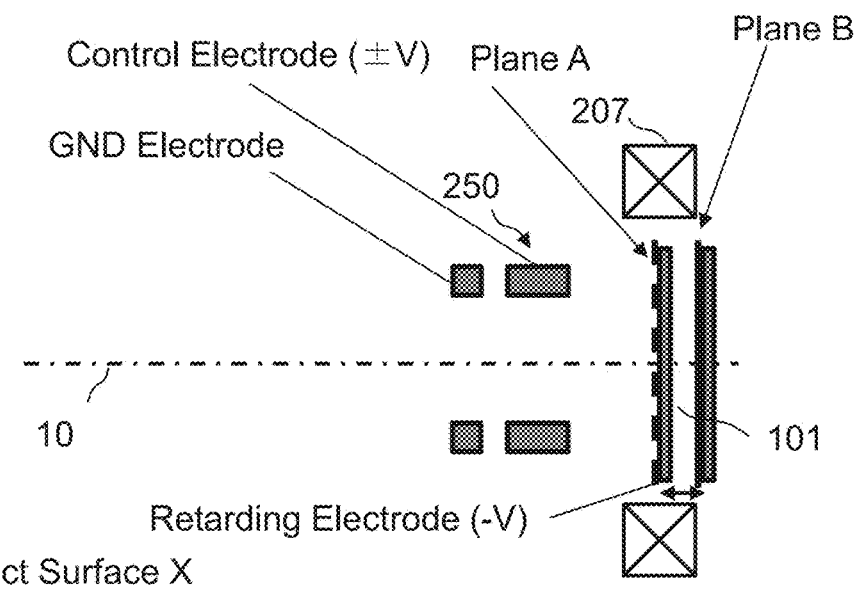
FIG. 4A shows an example of arrangement structure of an objective lens and an electrostatic lens according to the first embodiment.
Figure 4B:
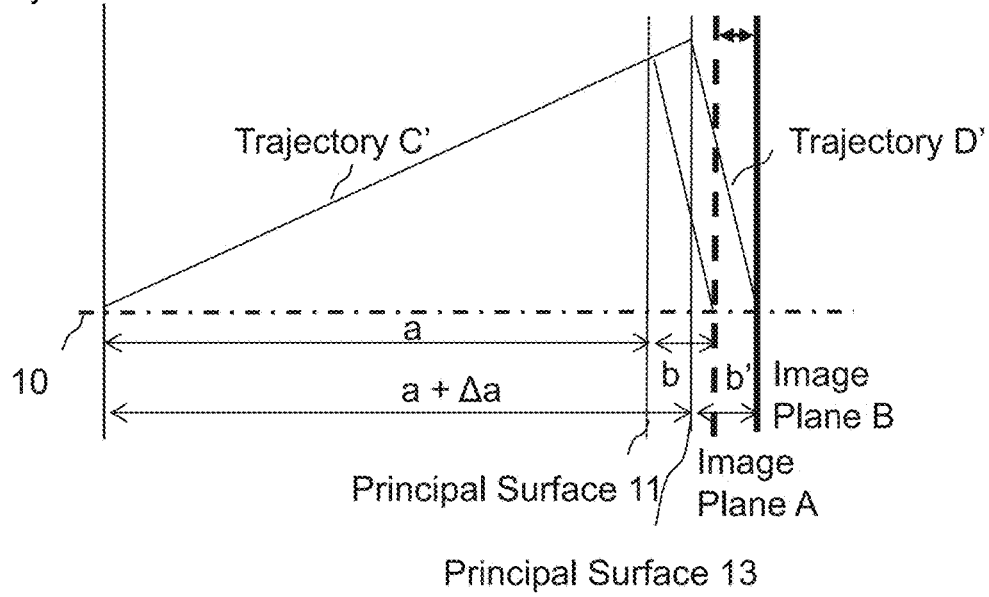
FIG. 4B shows a central beam trajectory according to the first embodiment.

FIG. 4A shows an example of arrangement structure of an objective lens and an electrostatic lens according to the first embodiment. FIG. 4B shows a central beam trajectory according to the first embodiment. As shown in FIG. 4A, in the first embodiment, the electromagnetic lens 207 (objective lens) is disposed such that the center of the magnetic field is located at the surface of the substrate 101. Then, the multiple beams are focused onto, for example, the plane A of the substrate 101 by the electromagnetic lens 207 (objective lens) at the position described above. Moreover, in the first embodiment, the control electrode (middle electrode 254), to which a control potential is applied, is arranged on the upstream side of the maximum magnetic field of the electromagnetic lens 207 with respect to the direction of the trajectory central axis 10 of the multiple beams 20, and a ground electrode (upper electrode 252), to which a ground potential is applied, is arranged on the upstream side of the control electrode with respect to the direction of the trajectory central axis 10. A negative potential is applied to the substrate 101. According to the first embodiment, the electrostatic lens 250 which generates an electrostatic field is configured by the ground electrode (upper electrode 252), the control electrode (middle electrode 254), and the bias electrode (lower electrode) being the substrate 101. With this structure, in the first embodiment, the principal surface 11 of the lenses, namely the electromagnetic lens 207 (objective lens) and the electrostatic lens 250, can be formed at the height position between the control electrode and the substrate 101. When the substrate 101 surface is changed, for example, from the plane A to the plane B, the multiple beams are dynamically focused onto the plane B by generating an electrostatic field by the electrostatic lens 250, in accordance with the change of the height position of the surface of the substrate 101. In such a case, according to the first embodiment, if setting the magnification at the image plane A to be M, and the magnification in the case of being focused on the plane B to be M2, as shown in FIG. 4B, the magnification M can be defined by the equation (1) described above using the distance "a" from the object surface X to the principal surface 11 of the lenses, and the distance "b" to the image plane A from the lens principal surface 11.

When the focus position is corrected from the image plane A to the image plane B, the position of the principal surface 11 of the lenses can be changed to the position of a principal surface 13 of the lenses according to the structure of the first embodiment. Consequently, the distance "a" is shifted by a change amount Δa of the lens principal surface, the distance "b" is changed to the distance "b'". Therefore, the magnification M2 can be defined by the following equation (3) using a distance (a+Δa) to the principal surface 13 of the lenses, and the distance "b'" to the principal surface 13 of the lenses. The principal surface 13 of the lenses indicates here a plane at the position of the intersection between the trajectory C of an electron emitted to the principal surface 13 of the lenses from the object surface X, and the trajectory D' of an electron going to the image plane B from the principal surface 13 of the lenses.

$$M2=b'/(a+\Delta a) \quad (3)$$

Figure 5:
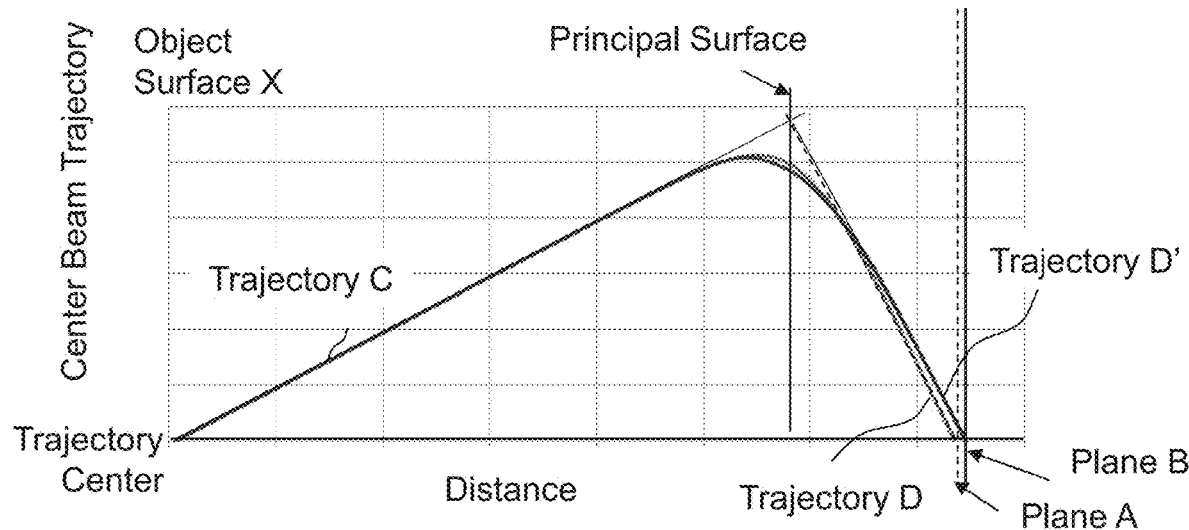
FIG. 5 shows an example of change of a central beam trajectory by dynamic focusing, obtained by simulation, according to a comparative example of the first embodiment.

FIG. 5 shows an example of change of a central beam trajectory by dynamic focusing, obtained by simulation, according to a comparative example of the first embodiment.

Figure 6:
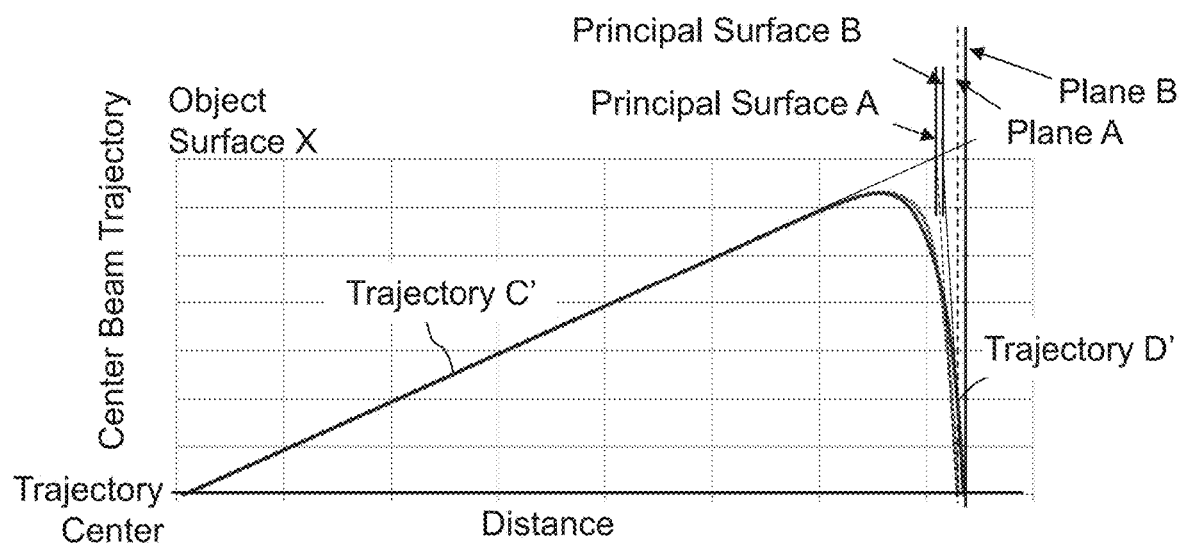
FIG. 6 shows an example of change of a central beam trajectory by dynamic focusing, obtained by simulation, according to the first embodiment.

FIG. 6 shows an example of change of a central beam trajectory by dynamic focusing, obtained by simulation, according to the first embodiment. As shown in FIG. 5, in the comparative example of the first embodiment, since the electrostatic lens 251 is disposed at the center of the magnetic field, the principal surface of the lens does not change even when dynamic focusing is performed. In contrast, according to the first embodiment, as shown in FIG. 6, since the electrostatic lens 250 is disposed at the position deviated from the center of the magnetic field, the focus position is corrected from the image plane A to the image plane B, the position of the principal surface A of the lens can be changed to the position of the principal surface B of the lens. Furthermore, according to the first embodiment, since the center of the magnetic field is located at the surface of the substrate 101, it is possible to rapidly change the central beam trajectory. Therefore, the difference between the distance "b" and distance "b'" can be made sufficiently small. Similarly, the difference between the positions of the lens principal surface A and the lens principal surface B can be made sufficiently small.

As described above, according to the first embodiment, since the center of the magnetic field is located, for example, at the image plane A of the substrate 101, each of the distance "b" and the distance "b'" is sufficiently short compared to the distance "a". Therefore, it can be approximated as b=b'. Moreover, the change amount Δa of the lens principal surface is sufficiently smaller than the distance "a". Thus, the equation (3) can be transformed to the equation (4).

$$M2=b'/(a+\Delta a) \approx b/a=M \quad (4)$$

Therefore, as shown in the equation (4), even when the focus position change ΔZ is corrected by the electrostatic lens 250 of the first embodiment, the magnification change ΔM of an image can be made small. Furthermore, since the electrostatic lens 250 is arranged at the position deviated from the center of the magnetic field, the rotation change ΔZ can be made small.

Figure 7:
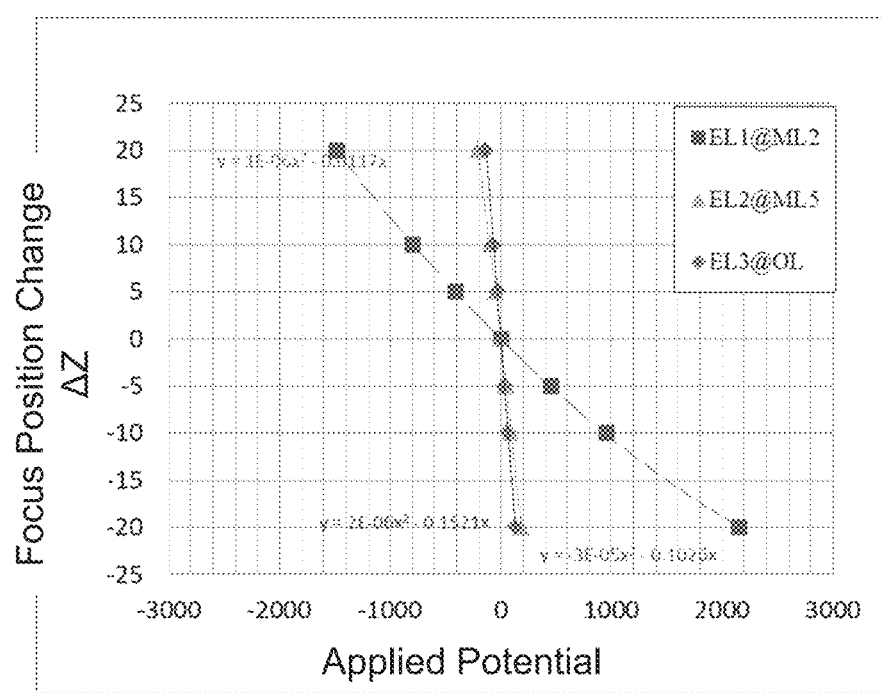
FIG. 7 shows an example of relation between a focus position change and an applied potential of each electrostatic lens according to the first embodiment.

FIG. 7 shows an example of the relation between a focus position change and an applied potential of each electrostatic lens according to the first embodiment. In FIG. 7, the ordinate axis represents a focus position change ΔZ (focus position change) (its unit is a.u.), and the abscissa axis represents an electric potential (its unit is a.u.) to be applied to the control electrode (middle electrode). As shown in FIG. 7, each of the electrostatic lens 240 (EL2) and the electrostatic lens 250 (EL3) has a larger focus position change ΔZ than that of the electrostatic lens 230 (EL1) with respect to the applied potential. In other words, each of the electrostatic lens 240 (EL2) and the electrostatic lens 250 (EL3) has a higher sensitivity to the focus position change ΔZ than that of the electrostatic lens 230 (EL1). Particularly, the electrostatic lens 250 (EL3) has a high sensitivity to the focus position change ΔZ.

Figure 8:
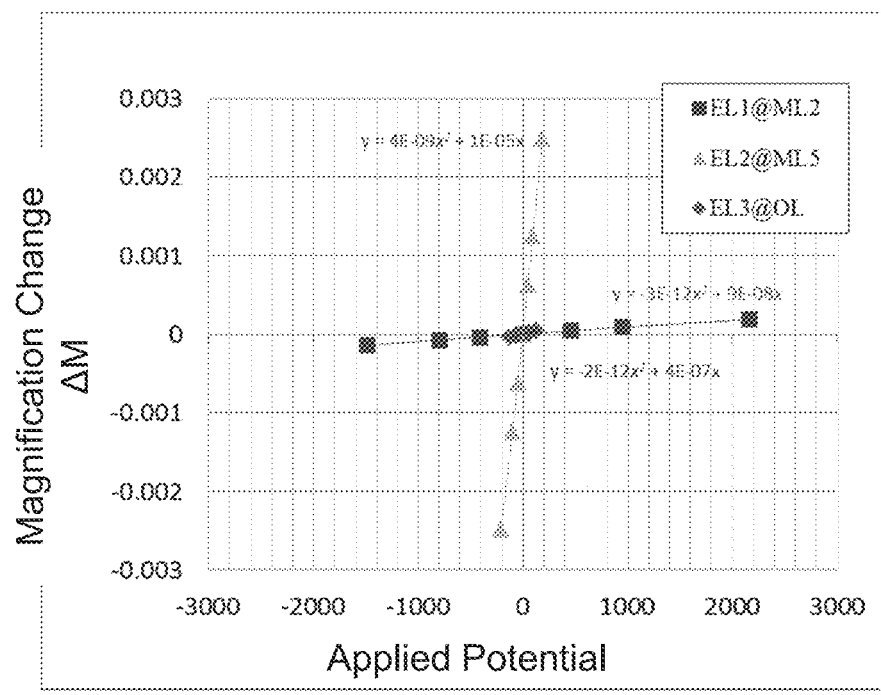
FIG. 8 shows an example of relation between a magnification change and an applied potential of each electrostatic lens according to the first embodiment.

FIG. 8 shows an example of the relation between a magnification change and an applied potential of each electrostatic lens according to the first embodiment. In FIG. 8, the ordinate axis represents a magnification change ΔM (its unit is a.u.), and the abscissa axis represents an electric potential (its unit is a.u.) to be applied to the control electrode (middle electrode). As shown in FIG. 8, the electrostatic lens 240 (EL2) has a larger magnification change ΔM than that of each of the electrostatic lens 230 (EL1) and the electrostatic lens 250 (EL3) with respect to the applied potential. In other words, it is possible to make the sensitivity to the magnification change ΔM of the electrostatic lens 240 (EL2) higher than that of each of the electrostatic lens 230 (EL1) and the electrostatic lens 250 (EL3). As for the electrostatic lens 250 (EL3), its magnification change ΔM is small as described above. The beam trajectory spread of the center beam, for example, of the multiple beams 20 in the arrangement position of the electrostatic lens 240 (EL2) is larger than that in the arrangement position of the electrostatic lens 230 (EL1) as shown in FIG. 1. Then, because of the amount of the larger spread of the beam trajectory of the center beam, for example, of the multiple beams 20, it is possible to make the sensitivity to the magnification change ΔM of the electrostatic lens 240 (EL2) higher than that of the electrostatic lens 230 (EL1).

Figure 9:
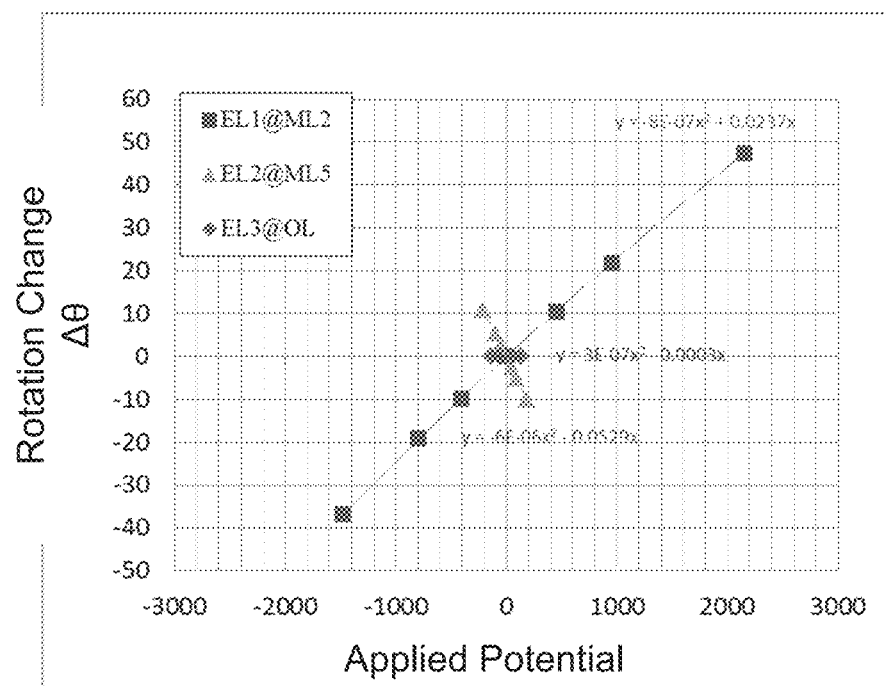
FIG. 9 shows an example of relation between a rotation change and an applied potential of each electrostatic lens according to the first embodiment.

FIG. 9 shows an example of the relation between a rotation change and an applied potential of each electrostatic lens according to the first embodiment. In FIG. 9, the ordinate axis represents a rotation change Δθ (its unit is a.u.), and the abscissa axis represents an electric potential (its unit is a.u.) to be applied to the control electrode (middle electrode). As shown in FIG. 9, each of the electrostatic lens 230 (EL1) and the electrostatic lens 240 (EL2) has a larger rotation change Δθ than that of the electrostatic lens 250 (EL3) with respect to the applied potential. In other words, it is possible to make the sensitivity to the rotation change Δθ of each of the electrostatic lens 230 (EL1) and the electrostatic lens 240 (EL2) higher than that of the electrostatic lens 250 (EL3). Regarding the electrostatic lens 250 (EL3), its rotation change Δθ is small as described above.

According to the first embodiment, as for the electrostatic lens 230 (EL1), its sensitivity to the rotation change Δθ can be sufficiently high compared to the sensitivity to each of the focus position change Δ and the magnification change ΔM as described above. As for the electrostatic lens 240 (EL2), its sensitivities to all of the focus position change ΔZ, the magnification change ΔM, and the rotation change Δθ can be high. As for the electrostatic lens 250 (EL3), it is possible to make the sensitivity to the focus position change ΔZ high while suppressing the sensitivities to the magnification change ΔM and the rotation change Δ to be low. As described above, according to the first embodiment, it is possible to make the sensitivities to the three change factors, that is, the focus position change ΔZ, and the magnification change ΔM and rotation change Δθ of an image different from each other among the three electrostatic lenses 230, 240 and 250.

Then, according to the first embodiment, an electrostatic field is generated by the electrostatic lens 250 (EL3) to dynamically focus the multiple beams 20 onto the substrate 101 to be corresponding to the focus position change ΔZ of the height position of the surface of the substrate 101. The rotation change Δθ and magnification change ΔM of an image of multiple beams generated by the dynamic focusing control by the electrostatic lens 250 are corrected by the electrostatic lens 230 (EL1) and the electrostatic lens 240 (EL2). Even if a control potential needed for correcting the focus position change ΔZ is applied to the electrostatic lens 250 (EL3), the magnification change ΔM and the rotation change Δθ, sensitivities to which are low, can be inhibited to be small. Therefore, if the magnification change ΔM and the rotation change Δθ which were suppressed to be small are corrected by the electrostatic lens 230 (EL1) and the electrostatic lens 240 (EL2), control potentials to be applied to the electrostatic lens 230 (EL1) and the electrostatic lens 240 (EL2) can be made low. For example, the electrostatic lens 230 (EL1), whose sensitivity to the rotation change Δθ is high, corrects the rotation change Δθ. The electrostatic lens 240 (EL2), whose sensitivity to the magnification change ΔM is high, corrects the magnification change ΔM. As a result, the focus position change ΔZ by the electrostatic lens 230 (EL1) and the electrostatic lens 240 (EL2) can be inhibited to be ignorably small.

According to the first embodiment, as described above, controlling the three electrostatic lenses 230, 240, and 250 becomes easy, and the control system of the lens control circuit 124 which performs the controlling can be simplified compared to the conventional one. It is preferable to generate a table (not shown) defining control potentials, with respect to the focus position change ΔZ, to be applied to the control electrodes (middle electrodes) of the electrostatic lenses 230, 240, and 250, and to store the table in a storage device (not shown). Moreover, the height change amount of the surface of the substrate 101 may be measured by a z-sensor, etc. (not shown).

Figure 10:
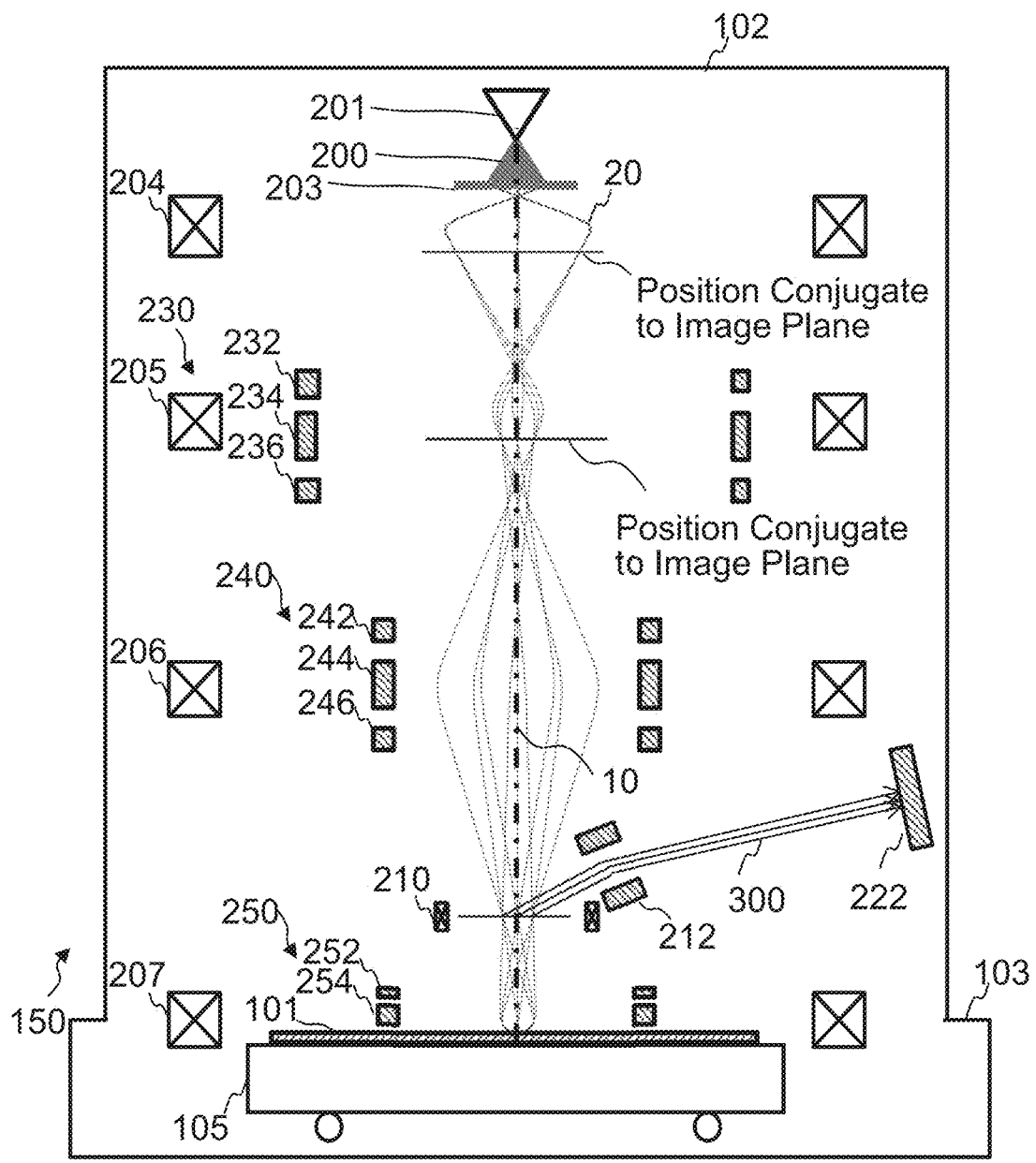
FIG. 10 is a structure diagram showing a modified example of the structure of a pattern inspection apparatus according to the first embodiment.

FIG. 10 is a structure diagram showing a modified example of the structure of a pattern inspection apparatus according to the first embodiment. Specifically, FIG. 10 shows a structure of the image acquisition mechanism 150 in the inspection apparatus 100. In FIG. 10, the electrostatic lens 230 located on the upstream side of the electrostatic lens 240 with respect to the direction of the trajectory central axis 10 is disposed at a position conjugate to the image plane (image plane conjugate position) of the multiple beams focused by the electromagnetic lens 205. Specifically, the intermediate height position of the middle electrode 234 used as a control electrode is arranged at the position conjugate to the image plane. Other structure elements are the same as those of FIG. 1. Then, at the position conjugate to the image plane of the multiple beams 20, even if an electric potential is applied to the electrostatic lens, the focus position change ΔZ and the magnification change ΔM do not occur. On the other hand, the rotation change Δθ of an image of the multiple beams may occur. Then, in the example of FIG. 10, by disposing the electrostatic lens 230 at the position conjugate to the image plane of multiple beams, an electric potential for correcting the rotation change Δθ can be applied to the electrostatic lens 230 without paying attention to the focus position change ΔZ and the magnification change ΔM. Moreover, since the electrostatic lens 230 is arranged in the magnetic field of the electromagnetic lens 205, it is possible to make the control potential applied to the electrostatic lens 230 low due to the influence of the magnetic field.

With the structure described above, the multiple beams 20, whose magnification change ΔM and rotation change Δθ due to the dynamic focusing have been corrected, can irradiate the substrate 101. Then, using the multiple secondary electron beams 300 resulting from the irradiation with such multiple beams 20, pattern inspection of the inspection substrate is performed.

Figure 11:
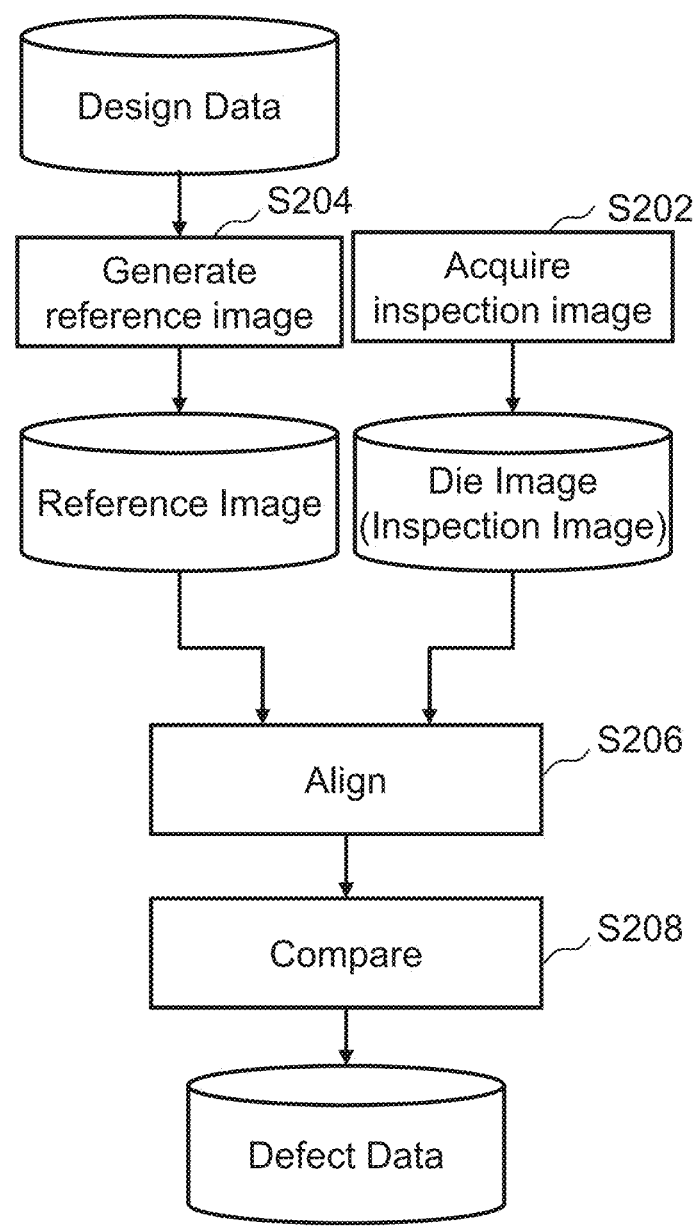
FIG. 11 is a flowchart showing main steps of an inspection method according to the first embodiment.

FIG. 11 is a flowchart showing main steps of an inspection method according to the first embodiment. In FIG. 11, the inspection method of the first embodiment executes a series of steps: an inspection image acquisition step (S202), a reference image generating step (S204), an alignment step (S206), and a comparison step (S208).

In the inspection image acquisition step (S202), the image acquisition mechanism 150 acquires a secondary electron image of a pattern formed on the substrate 101, by using the multiple beams 20. Specifically, it operates as follows:

As described above, the substrate 101 is irradiated with the multiple beams 20 whose magnification change ΔM and rotation change Δθ due to the dynamic focusing have been corrected.

Multiple secondary electron beams 300 including reflected electrons, each corresponding to each of the multiple beams 20, are emitted from the substrate 101 because desired positions on the substrate 101 are irradiated with the multiple beams 20. The multiple secondary electron beams 300 emitted from the substrate 101 travel to the beam separator 210, and are bent obliquely upward. Then, the trajectory of the multiple secondary electron beams 300 having been bent obliquely upward is bent by the deflector 212, and projected onto the multi-detector 222. Thus, the multi-detector 222 detects the multiple secondary electron beams 300, including reflected electrons, emitted because the substrate 101 surface is irradiated with the multiple beams 20.

Figure 12:
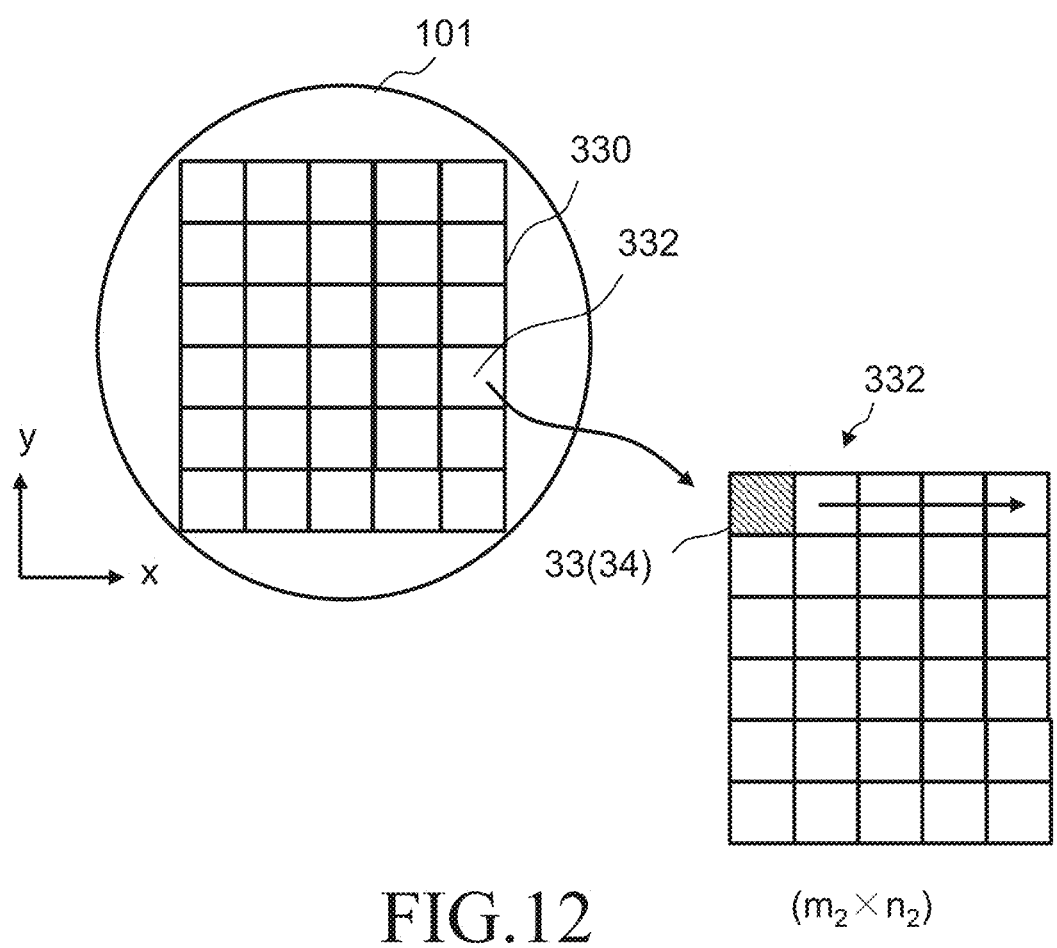
FIG. 12 shows an example of a plurality of chip regions formed on a semiconductor substrate, according to the first embodiment.

FIG. 12 shows an example of a plurality of chip regions formed on a semiconductor substrate, according to the first embodiment. In FIG. 12, in the case of the substrate 101 being a semiconductor substrate (wafer), a plurality of chips (wafer dies) 332 in a two-dimensional array are formed in an inspection region 330 of the semiconductor substrate (wafer die). A mask pattern for one chip formed on an exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or more), for example. In the first embodiment, a mask die 33 serves as a unit inspection region.

Figure 13:
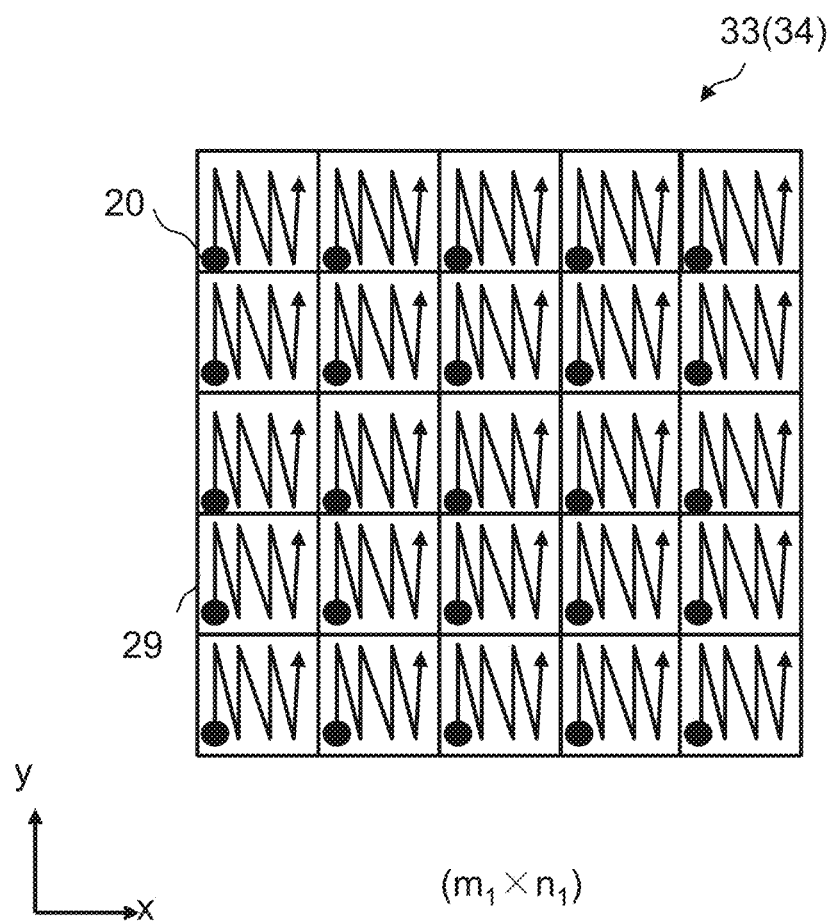
FIG. 13 illustrates a scanning operation using multiple beams according to the first embodiment.

FIG. 13 illustrates a scanning operation using multiple beams according to the first embodiment. FIG. 13 shows the case of multiple beams 20 of 5×5 (rows by columns). The size of an irradiation region 34 that can be irradiated by one irradiation with the multiple beams 20 is defined by (x direction size obtained by multiplying pitch between beams in x direction of the multiple beams 20 on the substrate 101 by the number of beams in the x direction)×(y direction size obtained by multiplying pitch between beams in y direction of the multiple beams 20 on the substrate 101 by the number of beams in the y direction). In the case of FIG. 13, the irradiation region 34 and the mask die 33 are of the same size. However, it is not limited thereto. The irradiation region 34 may be smaller than the mask die 33, or larger than it. Each beam of the multiple beams 20 scans the inside of a sub-irradiation region 29 surrounded by the pitch between beams in the x direction and the pitch between beams in the y direction, where the beam concerned itself is located. Each beam of the multiple beams 20 is associated with any one of the sub-irradiation regions 29 which are different from each other. At the time of each shot, each beam irradiates the same position in the associated sub-irradiation region 2S. Movement of the beam in the sub-irradiation region 29 is executed by collective deflection of the whole multiple beams 20 by a deflector (not shown). By repeating this operation, one beam irradiates all the pixels in order in one sub-irradiation region 29.

As described above, the whole multiple beams 20 scan the mask die 33 as the irradiation region 34, and that is, each beam individually scans one corresponding sub-irradiation region 29. After scanning one mask die 33, the irradiation region 34 is moved to a next adjacent mask die 33 in order to scan it. This operation is repeated to proceed scanning of each chip 332. Due to shots of the multiple beams 20, secondary electrons are emitted from the irradiated positions at each shot time to be detected by the multi-detector 222.

By performing scanning using the multiple beams 20 as described above, the scanning operation (measurement) can be performed at a higher speed than scanning with a single beam. The scanning of each mask die 33 may be performed by the "step and repeat" operation, alternatively it may be performed by continuously moving the XY stage 105. When the irradiation region 34 is smaller than the mask die 33, the scanning operation can be performed while moving the irradiation region 34 in the mask die 33 concerned.

In the case of the substrate 101 being an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the operation for scanning one chip increases (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected on which a figure pattern is formed, and detects the multiple secondary electron beams 300 emitted from the inspection substrate 101 due to irradiation by the multiple beams 20 onto the inspection substrate 101. Detected data (measured image: secondary electron image: image to be inspected) on a secondary electron from each position detected by the multi-detector 222 is transmitted as pattern image data to the comparison circuit 106.

In the reference image generating step (S204), a reference circuit 112 (reference image generation unit) generates a reference image corresponding to an inspection image to be inspected. Based on design data serving as a basis for forming a pattern on the substrate 101, or design pattern data defined in exposure image data of a pattern formed on the substrate 101, the reference circuit 112 generates a reference image for each frame region. Preferably, for example, the mask die 33 is used as the frame region. Specifically, it operates as follows: First, design pattern data is read from a storage device (not shown) through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When design pattern data used as the figure data is input to the reference circuit 112, the data is developed into data of each figure. Then, with respect to the data of each figure, interpretation is performed for the figure code, figure dimensions and the like indicating the figure shape. Then, the reference circuit 112 develops each figure data to design pattern image data of binary or multiple values as a pattern to be arranged in squares in units of grids of predetermined quantization dimensions, and outputs the developed data. In other words, the reference circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8 (=1/256)$, the occupancy rate in each pixel is calculated by allocating small regions which correspond to the region of figures arranged in the pixel concerned and each of which corresponds to a $1/256$ resolution. Then, 8-bit occupancy rate data is output to the reference circuit 112. The square region (inspection pixel) should be in accordance with the pixel of measured data.

Next, the reference circuit 112 performs appropriate filter processing on design image data of a design pattern which is image data of a figure. Since optical image data as a measured image is in the state affected by filtering performed by the optical system, in other words, in an analog state continuously changing, it is possible to match/fit the design image data with the measured data by also applying a filtering process to the design image data being image data on the design side whose image intensity (gray scale level) is represented by digital values. The generated image data of a reference image is output to the comparison circuit 108.

Figure 14:
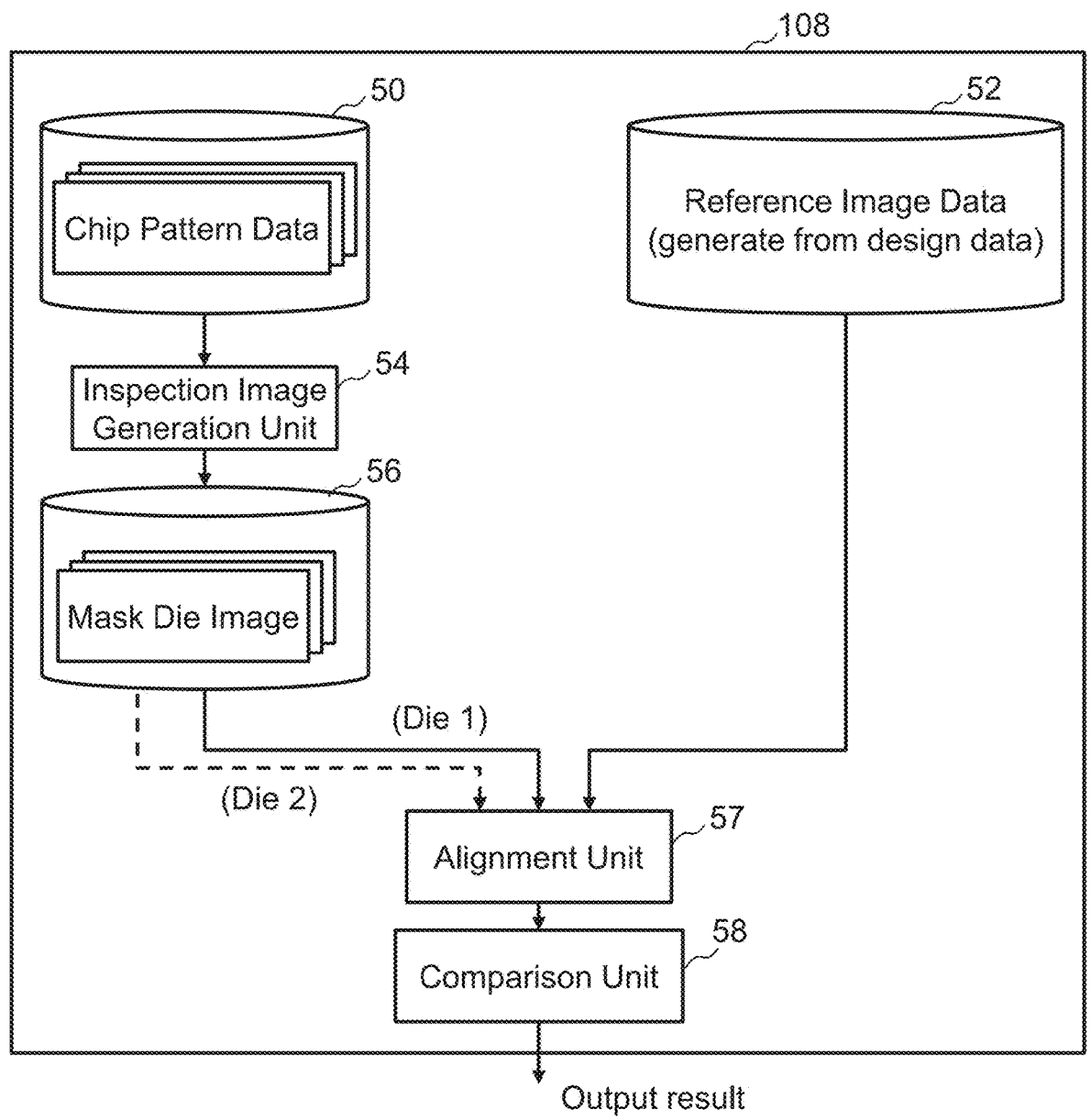
FIG. 14 shows an internal configuration of a comparison circuit according to the first embodiment.

FIG. 14 shows an internal configuration of a comparison circuit according to the first embodiment. In FIG. 14, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the inspection image generation unit 54, the alignment unit 57, and the comparison unit 58, and calculated results are stored in a memory (not shown) or in the memory 118 each time.

In the comparison circuit 108, transmitted pattern image data (secondary electron data) is temporarily stored in the storage device 50. Moreover, transmitted reference image data is temporarily stored in the storage device 52.

Next, the inspection image generation unit 54 generates a frame image (inspection image, that is, image to be inspected) by using pattern image data, for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads a mask die image serving as an inspection image, and a reference image corresponding to the mask die image, and provides alignment/positioning between the images based on a sub-pixel unit smaller than the pixel 36. For example, the alignment may be performed by a least-square method.

In the comparison step (S208), the comparison unit 58 compares the mask die image (inspection image) and the reference image concerned. The comparison unit 58 compares them, for each pixel 36, based on predetermined determination conditions in order to determine whether there is a defect such as a shape defect. For example, if a gray scale level difference of each pixel 36 is larger than a determination threshold Th, it is determined that there is a defect. Then, the comparison result is output, and specifically, output to a storage device, a monitor, or a memory (which are not shown), or alternatively, output from the printer.

Although the die-to-database inspection is described above, the die-to-die inspection may also be performed. In the case of conducting the die-to-die inspection, images of identical patterns on the same mask die 33 are compared. Accordingly, a mask die image of a partial region of the wafer die 332 serving as a die (1), and a mask die image of a corresponding region of another wafer die 332 serving as a die (2) are used. Alternatively, a mask die image of a partial region of the wafer die 332 serving as the die (1) and a mask die image of another partial region of the same wafer die 332 serving as the die (2), where identical patterns are formed, may be compared. In such a case, as long as one of the images of the mask die 33 on which identical patterns are formed is used as a reference image, inspection can be accomplished by the same method as that of the die-to-database inspection described above.

That is, in the alignment step (S206), the alignment unit 57 reads the mask die image of the die (1) and the mask die image of the die (2), and provides alignment between the images based on a sub-pixel unit smaller than the pixel 36. For example, the alignment may be performed by a least-square method.

Then, in the comparison step (S208), the comparison unit 58 compares the mask die image of the die (1) and the mask die image of the die (2). The comparison unit 58 compares, for each pixel 36, both the images, based on predetermined determination conditions in order to determine whether there is a defect such as a shape defect. For example, if a gray scale level difference of each pixel 36 is larger than a determination threshold Th, it is determined that there is a defect. Then, the comparison result is output, and specifically, output to the storage device, monitor, or memory, or alternatively, output from the printer.

As described above, according to the first embodiment, it is possible to make sensitivities with respect to change factors different from each other among electrostatic lenses. Accordingly, in the electrostatic lens control circuit made more efficient without being enlarged, three change factors such as the focus position change $\Delta Z$, and the magnification change $\Delta M$ and rotation change $\Delta \theta$ of an image can be corrected by using three efficiently optimized electrostatic lenses.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program to be executed by a processor or the like may be stored in a recording medium, such as a magnetic disk drive, magnetic tape drive, FD, ROM (Read Only Memory), etc. For example, the comparison circuit 108, the reference circuit 112, the electromagnetic lens control circuit 124, the electrostatic lens control circuit 126, etc. may be configured by at least one processing circuit described above.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed.

In addition, any other multiple electron beam irradiation apparatus, multiple electron beam irradiation method, and multiple electron beam inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam irradiation apparatus comprising:
   a stage configured to mount thereon a substrate to be irradiated with multiple electron beams;
   a first electromagnetic lens, disposed such that a center of a lens magnetic field is located at a height position of a surface of the substrate, configured to focus the multiple electron beams onto the substrate; and
   a first electrostatic lens configured using the substrate used as a bias electrode by being applied with a negative potential, a control electrode to which a control potential is applied and a ground electrode to which a ground potential is applied, the first electrostatic lens configured to provide dynamic focusing of the multiple electron beams onto the substrate, in accordance with change of the height position of the surface of the substrate, by generating an electrostatic field,
   wherein the control electrode is disposed on an upstream side of a maximum magnetic field of the lens magnetic field of the first electromagnetic lens with respect to a direction of a trajectory central axis of the multiple electron beams, and a ground electrode is disposed on an upstream side of the control electrode with respect to the direction of the trajectory central axis.

2. The apparatus according to claim 1, further comprising:
   a second electromagnetic lens and a third electromagnetic lens which are disposed on an upstream side of the first electrostatic lens with respect to the direction of the trajectory central axis;
   a second electrostatic lens disposed in a lens magnetic field of the second electromagnetic lens; and
   a third electrostatic lens disposed in a lens magnetic field of the third electromagnetic lens; wherein
   a rotation change and a magnification change of an image of the multiple electron beams, which are generated by the dynamic focusing by the first electrostatic lens, are corrected by the second electrostatic lens and the third electrostatic lens.

3. The apparatus according to claim 2, wherein one of the second electrostatic lens and the third electrostatic lens, which is located upstream with respect to the direction of the trajectory central axis, is disposed at a position conjugate to an image plane of the multiple electron beams.

4. A multiple electron beam irradiation method comprising:
   focusing multiple electron beams, which are to irradiate a substrate placed on a stage, onto the substrate by a first electromagnetic lens disposed such that a center of a lens magnetic field is located at a height position of a surface of the substrate; and
   dynamically focusing the multiple electron beams onto the substrate, in accordance with change of the height position of the surface of the substrate, by generating an electrostatic field by a first electrostatic lens including a control electrode which is disposed on an upstream side of a maximum magnetic field of the lens magnetic field of the first electromagnetic lens with respect to a direction of a trajectory central axis of the multiple electron beams and to which a control potential is applied, and a ground electrode which is disposed on an upstream side of the control electrode with respect to the direction of the trajectory central axis and to which a ground potential is applied, and using the substrate as a bias electrode by being applied with a negative potential.

5. A multiple electron beam inspection apparatus comprising:
   a stage configured to mount thereon a substrate to be irradiated with multiple electron beams;
   a first electromagnetic lens, disposed such that a center of a lens magnetic field is located at a height position of a surface of the substrate, configured to focus the multiple electron beams onto the substrate;
   a first electrostatic lens configured using the substrate used as a bias electrode by being applied with a negative potential, a control electrode to which a control potential is applied and a ground electrode to which a ground potential is applied, the first electrostatic lens configured to provide dynamic focusing of the multiple electron beams onto the substrate, in accordance with change of the height position of the surface of the substrate, by generating an electrostatic field, wherein the control electrode is disposed on an upstream side of a maximum magnetic field of the lens magnetic field of the first electromagnetic lens with respect to a direction of a trajectory central axis of the multiple electron beams, and a ground electrode is disposed on an upstream side of the control electrode with respect to the direction of the trajectory central axis; and
   a multi-detector that detects multiple secondary electron beams, including reflected electrons, emitted from the substrate because the substrate is irradiated with the multiple electron beams.

* * * * *